United States Patent [19]

Weathersby, Jr. et al.

[11] 3,999,080
[45] Dec. 21, 1976

[54] TRANSISTOR COUPLED LOGIC CIRCUIT

[75] Inventors: Scott Weathersby, Jr., Earl C. Wilson, both of Houston; Benjamin J. Sloan, Richardson; Robert C. Martin, Dallas, all of Tex.

[73] Assignee: Texas Instruments Inc., Dallas, Tex.

[22] Filed: Dec. 23, 1974

[21] Appl. No.: 535,405

[52] U.S. Cl. .............................. 307/203; 307/215; 307/218; 307/300; 307/315; 357/15; 357/40; 357/91
[51] Int. Cl.² ................ H03K 19/08; H03K 19/22; H03K 19/36
[58] Field of Search .......... 307/215, 203, 218, 300, 307/315; 357/15, 40, 91

[56] References Cited
UNITED STATES PATENTS

| | | | |
|---|---|---|---|
| 3,217,181 | 11/1965 | Zuk | 307/215 |
| 3,394,268 | 7/1968 | Murphy | 307/215 |
| 3,515,899 | 6/1970 | May | 307/213 X |
| 3,544,808 | 12/1970 | Mukai | 307/213 X |
| 3,624,620 | 11/1971 | Andrews | 307/289 X |

Primary Examiner—John Zazworsky

[57] ABSTRACT

A TTL logic circuit employing single emitter PNP input transistors instead of a multi-emitter input stage, in order to reduce loading on input drive devices. The circuit features a logic swing of 1.6 volts centered on a circuit threshold of 1.6 volts with the logic 0 and logic 1 levels being internally clamped with p-n diode junctions to prevent transistor saturation and improve transistor switching speeds over those normally obtained using Schottky diode clamping techniques. The circuit output incorporates a Darlington stage and provides a logic 1 drive capability permitting the circuit to drive a terminated signal line having a low characteristic impedance, typically 50 ohms while maintaining a logic 1 level above 2.0 volts at 25° C. Use of ion implantation techniques to define the isolation, emitter and base regions as well as the p-n diode junctions permits smaller device geometries and high $F_T$ transistors capable of high speed switching.

22 Claims, 4 Drawing Figures

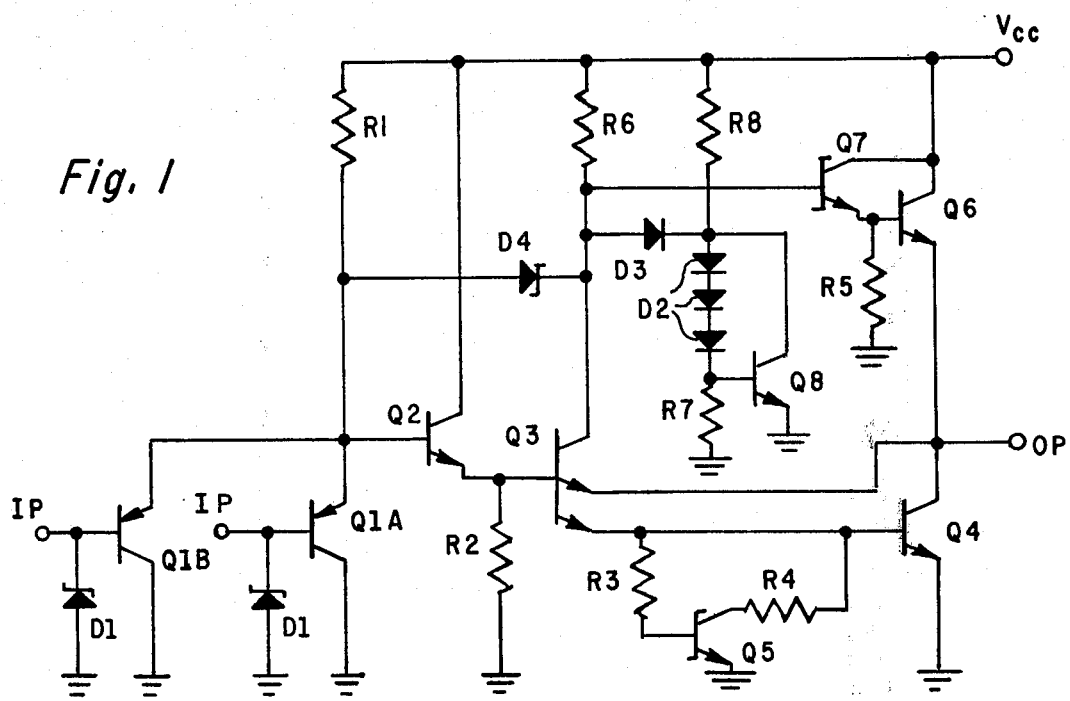
Fig. 1
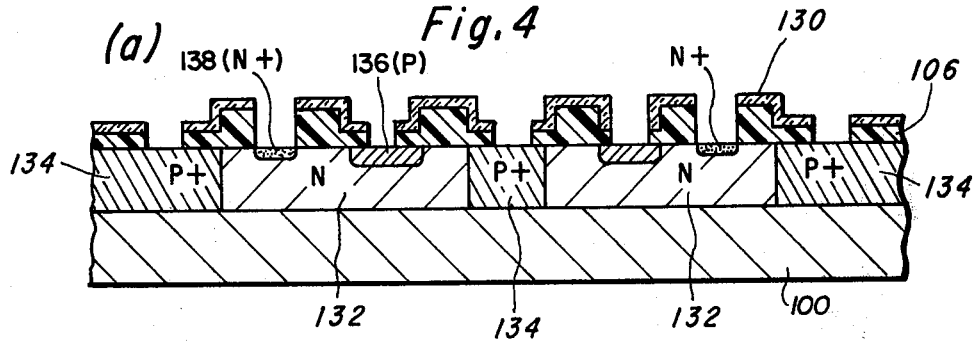
Fig. 4 (a)
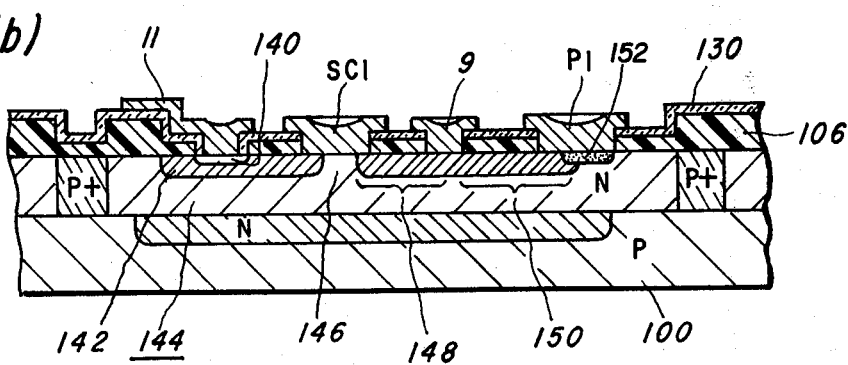
(b)

TRANSISTOR COUPLED LOGIC CIRCUIT

This invention relates to logic circuits employing transistor coupling, commonly known as transistor transistor logic (TTL) circuits.

Typical conventional TTL circuits employ multi-emitter transistors as input devices, and are characterized by a relatively heavy current drain on input drive devices. Operation of such logic circuits typically involves individual transistors being driven into a saturated state of conduction, thereby decreasing the switching speed and increasing the propagation delay of such circuits. In order to improve the switching speed, Schottky diode clamps have been utilized across the base-collector junctions of transistors that would normally saturate during operation of the circuit, in order to prevent occurrence of saturation. However, although such logic circuits have widespread use, they have limited suitability for very high speed applications wherein they are required to drive relatively low impedance output circuits, e.g., signal transmission lines, which typically have a 50 ohm characteristic impedance.

According to the present invention, a transistor coupled logic comprises at least two first input transistors, a second transistor and a third output transistor, each first transistor being of complementary conductivity type to that of said second and third transistors.

First circuit means couples the emitter of each first transistor to the base of the second transistor for switching the second transistor between conductive and non-conductive states in response to predetermined input signals applied to the bases of the input transistors. The emitter circuit of the second transistor is coupled to the base of the third output transistor such that when the second transistor is in a conductive state, the third output transistor conducts to provide a first logic signal level at the collector thereof. The collector circuit of the third transistor includes transistor load means having a base input cooperatively coupled with the collector circuit of the second transistor such that switching of the second transistor to a conductive state biases the transistor load means to a non-conductive condition whereas switching of the second transistor to a non-conductive state biases the transistor load means to a conductive state. When in a conductive state, the transistor load means provides a second logic signal level at the collector of the said third transistor. P-N diode junction means is operatively connected to the load transistor means in order to clamp the second logic signal level to a predetermined level.

In a preferred embodiment of the invention, a plurality of PNP input transistors are used, the emitter of each input transistor being connected in common to the base of an NPN emitter-follower stage, the output of which is connected to the base of a multi-emitter NPN transistor. One emitter of the multi-emitter NPN transistor is connected to the base of an NPN output transistor while a second emitter is connected to the collector of the output transistor. The collector current of the multi-emitter transistor is thus shared between the collector and base of the output transistor and is such that the output transistor can conduct only in a non-saturated mode. When the multi-emitter transistor is switched to a conductive state in response to preselected input signal conditions at the bases of the PNP input transistors, the output transistor conducts, and a logic 0 signal appears at the collector of the output transistor, the level of the logic 0 signal being clamped at a level defined by the internal characteristics of the multi-emitter transistor and output transistor. The collector circuit of the multi-emitter transistor is also coupled to the base input of an NPN Darlington pair having an emitter output connected to the collector of the output transistor. In response to a separate set of input conditions at the bases of the PNP input transistors, the multi-emitter transistor becomes non-conductive and the NPN Darlington pair switches to a conductive state resulting in a logical 1 signal level appearing at the collector of the output transistor. The logical 1 output signal level is clamped to a predetermined value by a p-n junction diode level clamping network connected to the base input of the Darlington pair. Such a circuit provides well-defined and clamped logical 0 and logical 1 output signal levels and a well-defined threshold between them providing for improved temperature stability. The NPN Darlington pair provide a low output impedance at the collector of the output transistor in the logical 1 output signal condition resulting in enhanced capability for providing high current drive of low input impedance networks. Use of p-n diode junction clamping at the base input of the Darlington pair also improves switching speed and enhances the temperature stability of the circuit.

Additional improvements in switching speed of a logical circuit constructed in accordance with the present invention also may be provided by use of ion implantation to define the isolation, emitter and base areas of the transistors. Use of such techniques permits a reduction in transistor areas (as well as associated reduction in parasitic capacitance) as compared with definition of the isolation, emitter and base regions using conventional diffusion techniques, and the fabrication of transistors having increased switching speed characteristics.

In order that the invention may be more readily understood and put into effect, an embodiment thereof will be described with reference to the drawings wherein:

FIG. 1 is a circuit diagram of a simple NAND gate embodying the invention;

FIG. 4 shows diagrammatic cross sections on the lines A—A and B—B of FIG. 2.

Figure 2:
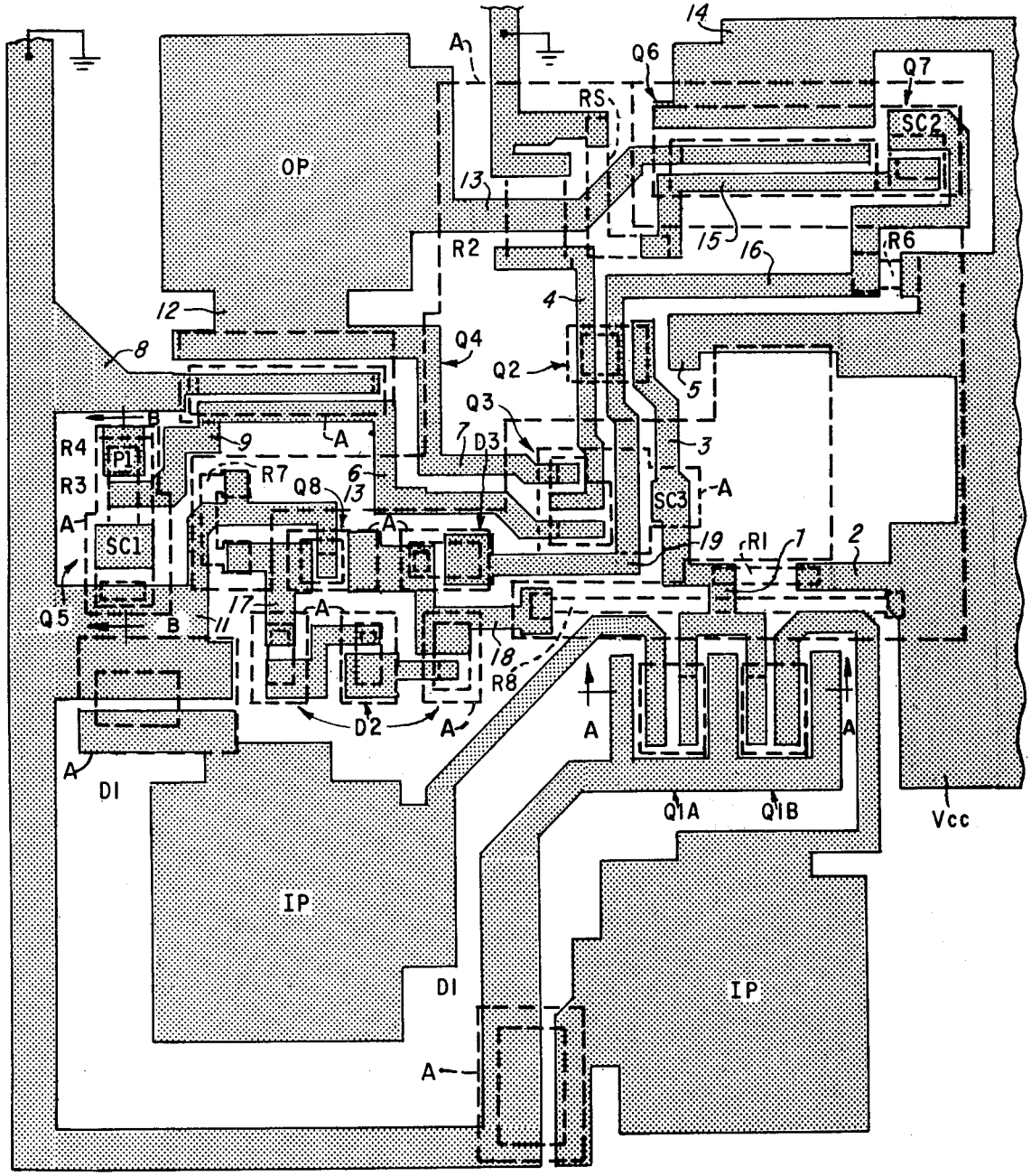
FIG. 2 is a plan view of an integrated circuit realization of the circuit of FIG. 1.

The circuit illustrated by FIGS. 1 and 2 include grounded collector PNP input transistors $Q_{1A}$ and $Q_{1B}$, each having a Schottky base-clamping diode $D_1$ connected between its base and ground, the base of each transistor also being connected to an input terminal IP. The emitters of transistors $Q_{1A}$ and $Q_{1B}$ are connected by conductor 1 to a common load resistor $R_1$ connected by conductor 2 to a positive voltage supply line $V_{CC}$. The emitters of transistors $Q_{1A}$ and $Q_{1B}$ also are connected by conductor 3 to the base of an NPN transistor $Q_2$ arranged in emitter-follower configuration, with the emitter connected by conductor 4 to an emitter load resistor $R_2$. The collector of transistor $Q_2$ is connected directly to the collector supply line $V_{CC}$ by conductor 5. The emitter of transistor $Q_2$ is also connected by the conductor 4 to the base of a phase-splitter NPN multi-emitter transistor $Q_3$ which has two emitters connected by respective conductors 6 and 7, to the base and collector of an NPN output transistor $Q_4$, the emitter of which is grounded by conductor 8. The base of transistor $Q_4$ is also connected (conductors 9 and $P_1$) by resistors $R_3$ and $R_4$ to the base and collector respectively of a Schottky-clamped NPN transistor $Q_5$, the emitter of which is grounded by conductor 11, and which limits the voltage developed across the base-emitter junction of transistor $Q_4$. The Schottky diode contact between the base and collector of transistor $Q_5$ is shown at SC1.

The output from the logic circuit is obtained at terminal OP connected by conductor 12 to the collector of transistor $Q_4$ and by conductor 13 to the emitter of NPN transistor $Q_6$ which together with Schottky-clamped NPN transistor $Q_7$ forms a Darlington pair load circuit for the transistor $Q_4$. A resistor $R_5$ connects the base of transistor $Q_6$ (emitter of transistor $Q_7$) to ground. The transistors $Q_6$ and $Q_7$ have a common collector region and are connected directly to the collector supply line $V_{CC}$ by conductor 14. The base of transistor $Q_6$ is connected by conductor 15 to the emitter of transistor $Q_7$ which has a contact SC2 contacting the base-collector region to define the Schottky clamp.

The collector of the phase-splitter transistor $Q_3$ is connected by conductor 16 to a resistor $R_6$ which is connected to the supply line $V_{CC}$ and also directly to the base of transistor $Q_7$. Additionally, the collector of transistor $Q_3$ is connected to a level clamping circuit comprising an NPN transistor $Q_8$ the collector and base of which are shunted by three series connected p-n junction diodes $D_2$ poled in the same direction as the base-emitter junction of the transistor $Q_8$. The base of transistor $Q_8$ is connected by conductor 17 to a resistor $R_7$ which in turn is connected to ground by conductor 11. The collector of transistor $Q_8$ is connected by conductor 18 to a resistor $R_8$ which is connected to the supply line $V_{CC}$ and by a p-n junction diode $D_3$, poled in the same direction as diodes $D_2$ to conductor 19 connected to the collector of transistor $Q_3$.

The emitters of transistors $Q_{1A}$ and $Q_{1B}$ are connected to the anode of a current limiting Schottky diode $D_4$, the cathode of which is connected to the collector of transistor $Q_3$. The Schottky barrier junction is defined by conductive pad SC3 making barrier contact with the collecter region of transistor $Q_3$.

The circuit shown in FIG. 2 employs p-n junction isolation, the isolated islands being located within the broken lines areas identified by reference A.

Logic input signals are applied via input terminals IP to the bases of the PNP transistors $Q_{1A}$ and $Q_{1B}$ which, when switched ON (corresponding to logic 0 inputs to their bases) provide only light loading to the driving devices; since the transistor $Q_{1A}$ and $Q_{1B}$ have current gain, the majority of the input current is by-passed to ground and the current sinked out of their bases is minimized. With both of transistors $Q_{1A}$ and $Q_{1B}$ switched OFF, (corresponding to logic 1 inputs to the bases of those transistors) the emitter-follower transistor $Q_2$ is driven ON which switches phase-splitter transistor $Q_3$ to a conductive state, supplying base drive current to transistor $Q_4$ which is switched to a conductive state. The connection of the emitters of transistor $Q_3$ to the base and collector, respectively, of transistor $Q_4$ serves to prevent transistor $Q_4$ conducting in a saturated mode since should that transistor tend to saturate, the increased collector current supplied by the emitter of transistor $Q_3$ connected thereto, results in decreased current supplied to the base of transistor $Q_4$ from the other emitter of transistor $Q_3$ so that saturation is obviated. A heavy base current drive is required to switch on transistor $Q_4$ and the transistor $Q_3$ is prevented from conducting in a saturated mode by the Schottky diode $D_4$ which, when the collector current of $Q_3$ approaches saturation, is biased to a conductive state due to the voltage drop across resistor $R_6$. Conduction of diode $D_4$ reduces the base drive to transistor $Q_3$ supplied by emitter-follower transistor $Q_2$ and thus saturation of transistor $Q_3$ is prevented.

The collector current of $Q_3$ is designed such that while transistor $Q_3$ is conductive there is no current flow through $D_3$ and the base bias applied to transistor $Q_7$ is insufficient to cause conduction of the Darlington pair $Q_6$, $Q_7$.

Thus, under the above-described conditions, with transistors $Q_{1A}$ and $Q_{1B}$ both switched OFF, (logical 1 inputs) the transistor $Q_4$ is switched ON with the signal level at the output terminal OP clamped to the $V_{BE}$ level of transistor $Q_4$ ($V_{BEQ4} + V_{BE1Q3} - V_{BE2Q3}$) corresponding to a logical zero output.

With a logical 0 input to either or both of the input transistors $Q_{1A}$ and $Q_{1B}$, the transistors $Q_2$, $Q_3$ and $Q_4$ are in a non-conductive state. Current flow occurs through resistor $R_6$, diodes $D_3$ and $D_2$ and resistor $R_7$, maintaining transistor $Q_8$ in a conductive state and defining the base voltage of transistor $Q_7$ at a level corresponding to $5 \times V_{BE}$ (due to $V_{BE}$ of $Q_8$, $D_2$ and $D_3$) so that the Darlington pair $Q_6$, $Q_7$ conducts, resulting in a logical 1 signal at the output terminal OP. Due to the $V_{BE}$ drops of $Q_6$ and $Q_7$ the logic 1 output level is thus clamped at $3 \times V_{BE}$. The resistor $R_8$ is tied directly to the collector of $Q_8$ so that a small amount of current through $R_8$ will keep the collector capacitance of $Q_8$ charged thus avoiding charging and discharging this capacitance each time the diode clamping circuit charges between active and inactive states. This charging operation is made possible by the diodes $D_2$ which also prevent the occurrence of forward biasing of the base-collector junction of $Q_8$ so that $Q_8$ does not conduct under saturation conditions.

The Darlington pair $Q_6$, $Q_7$ can supply high current to charge load capacitance and supply high load currents. In the logical 1 output condition of the circuit, $Q_6$, $Q_7$ provide a low output impedance at the output terminal OP which further enhances the capability to provide high current drive of low input impedance networks, e.g., such as may be presented by a standard 50 ohm transmission line. Switching speed from a logical 0 output to a logical 1 output also is increased since the collectors of $Q_6$, $Q_7$ are tied directly to $V_{CC}$ and the base of $Q_7$ is driven through the resistor $R_6$, thus avoiding forward biasing of the base-collector junctions of $Q_6$ and $Q_7$ so that conduction under saturation conditions does not occur. The Schottky base-collector clamp of $Q_7$ provides added protection against saturation under heavy drive conditions. Also it will be noted that since the upper logic level is clamped at $3 \times V_{BE}$ and the lower logic level at $1 \times V_{BE}$, a full logic swing of $2 \times V_{BE}$ is provided centered around a circuit threshold of $2 \times V_{BE}$ volts. Under typical operating conditions of the circuit, $V_{BE}$ and the diode junction forward voltage drops approximate 0.8 volts. Use of p-n junction diode clamping not only improves speed but also significantly reduces signal line noise resulting from the charging and discharging of signal line capacitance and enhances the temperature stability of the circuit.

The circuit as described with reference to FIG. 1 is advantageously fabricated using ion implantation techniques, permitting 20–30 percent reduction in transistor areas (and associated reduction in parasitic capacitance) compared with fabrication using conventional diffused junction techniques. Additionally, using an ion implantation technique, transistors having shallow base (e.g., 3000A) and emitter regions can be produced resulting in transistors having very high $F_T$ parameters (e.g., nominally in the range 1800 – 2000 MHz) with associated increase in switching speed and circuit stability.

A suitable ion implantation technique for fabricating a circuit as described with reference to FIG. 1 is described in detail in co-pending U.S. patent application Ser. No. 485,200 filed July 2, 1974 by Benjamin J. Sloan, Jr., and assigned to the assignee of the present application. Brief details pertinent to fabrication of the circuit shown in FIG. 1 are given below with reference to FIG. 3.

Using a p-type substrate 100, an n-type dopant is diffused into one surface thereof to form a heavily doped n+ type region 102. A thin n-type epitaxial layer 104 is then deposited on the surface of the substrate 100 to cover the region 102; suitably the epitaxial layer 104 has a thickness of about 1.2 microns.

As shown in FIG. 3b, a layer 106 of silicon oxide is thermally grown on the epitaxial layer 104 and a layer 108 of photoresist, e.g., that sold by KODAK under the designation MICRO RESIST 747 is applied over the silicon oxide layer 106. The photoresist layer 108 is then patterned and underlying regions of the silicon oxide layer 106 are etched, in conventional manner, to define an annular isolation aperture 110, a base region aperture 112 and a collector contact aperture 114 extending through the two layers 106 and 108 and shown in FIG. 3c. This permits the apertures 110 and 112 and 114 readily to be critically aligned relative one to another. Next a further layer of photoresist is applied and patterned to uncover the isolation aperture 110 while leaving the base and collect contact apertures 112 and 114 covered by photoresist areas 116. The structure is then subjected to implantation of boron ions to define a p-type isolation region 118 extending throughout the thickness of the epitaxial layer 104, the photoresist layers 108 and 116 and the silicon oxide layer 106 acting as implantation barriers. The resultant structure is shown in FIG. 3d.

Next, the photoresist layers 108 and 116 are stripped in conventional manner and thermal oxide grown to cover the apertures 110, 112 and 114, this thermal oxide growth process serving also to anneal the isolation region 118. Another photoresist layer is then applied and patterned so that only the collector contact aperture 114 is protected by a photoresist region 122. Boron ions are then implanted through the thin oxide regions in the apertures 110 and 112 to define p-type base region 124 and increase the surface doping level of the isolation region 118. The resulting structure is shown in FIG. 3f.

The photoresist area 122 is then stripped, using conventional techniques. An emitter aperture is then opened in the thin oxide layer 120 overlying the base region 124 while the thin oxide layer 120 in the collector contact aperture also is removed and the resultant structure subjected to an arsenic ion implantation to define an n+ type emitter region 126 and an n+ type collector contact region 128 as shown in FIG. 3g. A phosphorous doped chemical vapor deposited silicon oxide layer 130 is then formed over the entire structure, as shown in FIG. 3h and the structure annealed at a temperature of about 900° – 1000° C.

In the above described process steps, electron beam sensitive resists, e.g., polymethylmethacrylate resists, may be used in place of the photoresists mentioned, and patterning carried out by selective impingement of an electron beam over the resist.

Figure 3:
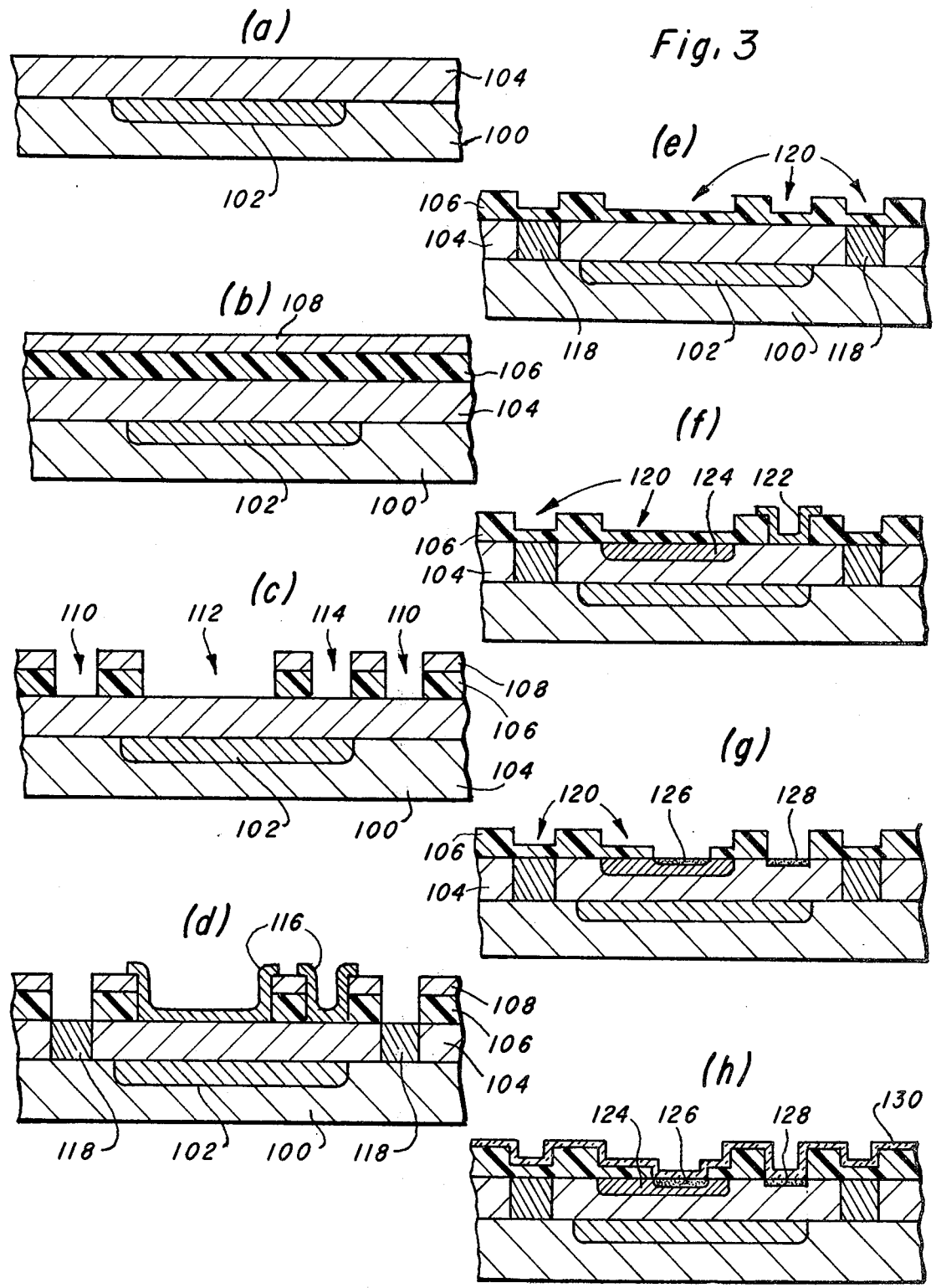
FIG. 3 illustrates schematically process steps suitable for use in fabrication of an integrated circuit embodying the present invention.

The above-described process steps specifically relate to fabrication of an NPN transistor but it will be appreciated that the resistors in the circuit can, as understood in the art, readily be defined during the base implantation step through appropriate thin oxide regions, similar to regions 120, formed in apertures in the silicon oxide layer 106 and having geometries corresponding to those of the resistor regions as shown in FIG. 3. Likewise, diodes corresponding to the p-n junction diodes $D_2$ and $D_3$ of FIG. 2 are formed by fabricating transistor structures in the manner described above and short circuiting either the base-emitter or base-collector junction and using the other junction as the junction diode. Referring to FIGS. 2 and 3, the base-collector junctions are shorted to provide diodes $D_2$, $D_3$. For definition of the Schottky base-collector diodes of $Q_5$ and $Q_7$, the base contact is formed to extend across the base-collector junction, making ohmic contact with the base and rectifying barrier contact with the collector region. The Schottky diode $D_1$ is defined using regions of the epitaxial layer 104 within isolated islands, formed as described above. Contact apertures to these epitaxial regions are defined at the same time as the collector contact apertures 114, using two apertures for each Schottky diode region with an n+ region formed through a first one of the apertures in a manner similar to and at the same time as formation of the collector contact regions 128. During the subsequent metallization process, the contacts to these n+ regions form ohmic contacts while the contacts through the second apertures directly to the epitaxial layer regions, form recitfying barrier contacts thereby defining the respective Schottky diodes. Schottky diode $D_4$ is formed by the contact pad SC3 making rectifying barrier contact with the collector of transistor $Q_3$ and ohmically connected with the emitter of transistor $Q_1$.

FIG. 4a shows the structure of the PNP transistors $Q_{1A}$ and $Q_{1B}$ in FIG. 2. These transistors share a common collector region provided by the semiconductor substrate 100, the n-type epitaxial layer base regions 132 of the transistors being surrounded by a P+ region 134 extending through the epitaxial layer to the substrate and formed concurrently with the P+ isolation regions as described with reference to FIG. 3. The p-type emitter region 136 and the N+ base contact region 138 are formed concurrently with the p-type base region and the N+ type collector contact region, respectively of the NPN transistors as described with reference to FIG. 3.

FIG. 4b shows the structure of the transistor $Q_5$ and its associated Schottky base-collector diode clamp and resistors $R_3$ and $R_4$ in FIG. 2. The transistor is an NPN structure formed as described with reference to FIG. 3 and has emitter, base and collector regions 140, 142 and 144, respectively.

An elongated P-type region is formed concurrently with the base region 142 and divided therefrom by a portion 146 of the N-type collector region 144. Portions 148, 150 of the elongated P-type region respectively define the resistors R₃ and R₄, the connection of the resistor R₄ to the collector region 144 being established by an N+ collector contact region 152 and the contact pad P1.

The Schottky diode base-collector clamp is defined by the metal contact pad SC1 making rectifying barrier contact to the collector region portion 146 and ohmic contact to the base region 142.

Application of suitable metal contact and interconnections between the various circuit elements, e.g., aluminum or a platinum, titanium-tungsten, aluminum system also define the barrier contacts for the Schottky diodes as described above, resulting in production of the circuit configuration of FIG. 1. Formation of these metal contacts and interconnections can be carried out using conventional metal definition and patterning techniques.

It is thus to be appreciated that a logic circuit constructed as described above provides advantages in respect of well-defined lower and upper logic signal output levels and a well-defined threshold between them providing for excellent temperature stability. Additionally, the circuit is capable of providing a high current drive into a low input impedance load at a relatively high voltage (2.4 volts in the specific circuit described) making the circuit especially suitable for applications in which, for example, the circuit is required to drive a 50 ohm transmission line. Utilizing the techniques described herein, logic circuits having propagation delays as low as 2 nanoseconds and typical power dissipation as low as 25 MW per gate can readily be fabricated in a reliable manner. Light loading on the input driving devices for the circuit is assured by the use of individual input transistors instead of the multi-emitter input transistors usually used in transistor coupled logic circuitry.

What is claimed is:

1. A logic circuit comprising at least two first input transistors, a second multi-emitter transistor and a third output transistor, said first transistors being of complementary conductivity type to that of said second and third transistors, circuit means connecting first and second emitters of said second transistor respectively to the collector and the base of said third transistor for permitting said third transistor to conduct only in an unsaturated mode; transistor load circuit means having a fourth transistor whose emitter is connected to the collector of said third transistor; circuit means connecting the collector of the second transistor to said transistor load circuit means; and circuit means connecting the emitters of said first transistors to the base of said second transistor such that when each said first transistor is turned off, said second and third transistors are turned on to provide a first logic signal level at the collector of said third transistor, and when any said first transistor is in a conductive state, said second and third transistors are turned off and said transistor load circuit means becomes conductive to provide a second logic signal level at the collector of said third transistor.

2. A logic circuit according to claim 1, further including unidirectional conductive means connecting the emitter of said first transistor and the collector of said second transistor to prevent saturation of said second transistor when in a conductive state.

3. A logic circuit according to claim 1, including a transistor emitter follower stage coupling the emitters of said first transistors to the base of said second transistor.

4. A logic circuit according to claim 1, wherein said transistor load circuit means comprises a Darlington pair transistor stage having a base input connected to the collector of said second transistor, said Darlington pair transistors having collectors connected directly to a d.c. voltage supply line for said circuit.

5. A logic circuit according to claim 4, including a p-n junction diode clamping circuit connected to the said base input of the Darlington pair to define the logic signal level at the collector of said third transistor when said Darlington pair is conductive.

6. A logic circuit including at least two PNP input transistors having their emitters respectively connected to the input of an NPN emitter-follower stage, the output of said emitter-follower stage connected to the base of a multi-emitter NPN transistor, an NPN output transistor, circuit means connecting the first and second emitters of said multi-emitter NPN transistor respectively to the collector and the base of said output transistor for permitting said output transistor to conduct only in a non-saturated mode; said multi-emitter transistor having a collector connected to the base input of an NPN Darlington pair having an emitter output connected to the collector of said output transistor, wherein said input transistors are in a conductive state, said multi-emitter transistor is conductive and drives said output transistor to a non-saturated conductive state resulting in a logic 0 signal at the collector of said output transistor; and wherein when at least one of said input transistors is in a non-conductive state said multi-emitter transistor is non-conductive and said Darlington pair conducts to provide a logical 1 output signal at the collector of said output transistor.

7. A logic circuit according to claim 6, including signal level defining circuit means connected to the base input of said Darlington pair for defining said logical 1 output signal level.

8. A logic circuit according to claim 7, wherein said signal level defining means includes an NPN transistor having a plurality of p-n junction diodes connected between the base and collector thereof and poled in the same direction as the base emitter junction of said transistor; and means connecting the collector of said transistor to the base input of said Darlington pair such that said diodes and said transistor become conductive when said multi-emitter transistor is non-conductive.

9. A logic circuit according to claim 6, including a Schottky diode connected between the emitters of said input transistors and the collector of said multi-emitter transistor to prevent conduction of said multi-emitter transistor in a saturated mode.

10. A logic circuit according to claim 6, wherein said Darlington pair includes a Schottky clamp diode connected across the base-collector junction of the transistor providing the base input for the Darlington pair.

11. A logic circuit including a first transistor having a collector at which logic output signals are generated; a second multi-emitter transistor; means electrically connecting the collector of said first transistor with an emitter of said second transistor for permitting said first transistor to conduct only in an unsaturated mode; means electrically connecting the base of said first transistor with another emitter of said second transistor; transistor load circuit means having a third transistor whose emitter is connected to the collector of said first transistor; and means connecting the collector of said second transistor to said transistor load circuit means such that said third transistor is conductive only when said second transistor is non-conductive.

12. A transistor coupled logic circuit comprising a plurality of first input transistors, a second multi-emitter transistor and a third output transistor, said first input transistor being of complementary conductivity type to that of said second and third transistors; circuit means connecting first and second emitters of said second transistor respectively to the collector and base of said third transistor; a Darlington pair transistor stage; collector circuit means connecting the collector of said third transistor to said Darlington pair transistor; conductive means connecting the collector of the second transistor to the base input of said Darlington pair stage; non-inverting transistor circuit means connecting the emitter of each said first input transistor to the base of the second transistor such that when said first transistors are turned off, said second and third transistors are turned on to provide a first logic signal level at the collector of said third transistor, said first logic signal level being clamped at the $V_{BE}$ level of said third transistor and when said first transistor is in a conductive state, said second and third transistors are turned off and said Darlington pair transistor becomes conductive to provide a second logic signal level at the collector of said third transistor; and n p-n diode junctions connected in series to the base input of said Darlington pair transistor stage for clamping said second logic signal level at a value equal to $V_{BE}$ volts.

13. A logic circuit according to claim 12, wherein n=5.

14. A logic circuit according to claim 13, wherein said 5 p-n diode junctions are provided by the base-emitter junction of a fourth transistor, three p-n diode junctions connected in series between the base and collector of said fourth transistor, and p-n diode junction connecting the collector of said fourth transistor to the base input of said Darlington pair of transistors.

15. A logic circuit according to claim 12, wherein said transistors are silicon transistors and said diode junctions are silicon diode junctions.

16. A logic circuit according to claim 12, wherein said non-inverting transistor circuit means comprises an emitter follower transistor stage.

17. A logic circuit according to claim 12, further including anti-saturation means respectively connected to said second and third transistors for preventing conduction thereof in a saturated state.

18. A logic circuit according to claim 12, fabricated as a monolithic integrated circuit.

19. A logic circuit according to claim 12, wherein the base and emitter regions of the respective said transistors comprise ion implanted regions in a common silicon substrate, and wherein said transistors are disposed in semiconductor islands defined by ion implanted isolation regions.

20. A transistor coupled logic circuit comprising at least two first input transistors, a second transistor and a third output transistor, each first transistor being of complementary conductivity type to that of said second and third transistors; first circuit means coupling the emitter of each first transistor to the base of the second transistor for switching said second transistor between conductive and non-conductive states in response to predetermined input signal conditions at the base of each input transistor; circuit means coupling the emitter of the second transistor to the base of the third output transistor such that when the second transistor is in a conductive state, said third output transistor conducts to provide a first logic signal at the collector thereof; said third output transistor having a collector circuit including transistor load means having an input cooperatively coupled with the collector of said second transistor such that switching of said second transistor to a conductive state biases the transistor load means to a non-conductive condition and switching of said second transistor to a non-conductive state biases the transistor load means to a conductive condition to provide a second logic signal level at the collector of said third transistor; and p-n diode junction means cooperatively connected to the load transistor means to clamp said second logic signal level at a predetermined value.

21. A circuit according to claim 20, wherein said second transistor is a multi-emitter transistor having first and second emitters respectively connected directly to the collector and base of said third output transistor for preventing conduction of said output transistor in a saturated state.

22. A logic circuit according to claim 20, wherein said transistor load means comprises a Darlington pair transistor stage having a base input and wherein said p-n diode junction means includes a plurality of p-n diode junctions connected in series with said base input, and means connecting the collectors of said Darlington pair directly to a d.c. supply line.

* * * * *